US011454105B2

(12) United States Patent
Ding et al.

(10) Patent No.: US 11,454,105 B2
(45) Date of Patent: Sep. 27, 2022

(54) RESERVOIR SIMULATION MODELING WITH WELL TRAJECTORY AT TRUE POSITIONS IN GRID SIMULATION MODELS

(71) Applicant: Saudi Arabian Oil Company, Dhahran (SA)

(72) Inventors: Xiang Yang Ding, Dhahran (SA); Larry Siu-Kuen Fung, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 482 days.

(21) Appl. No.: 16/394,455

(22) Filed: Apr. 25, 2019

(65) Prior Publication Data
US 2020/0340353 A1    Oct. 29, 2020

(51) Int. Cl.
| | | |
|---|---|---|
| E21B 47/22 | (2012.01) | |
| E21B 47/022 | (2012.01) | |
| G06F 30/20 | (2020.01) | |
| E21B 44/00 | (2006.01) | |

(52) U.S. Cl.
CPC ............ *E21B 47/022* (2013.01); *E21B 44/00* (2013.01); *G06F 30/20* (2020.01)

(58) Field of Classification Search
CPC .... E21B 47/022; E21B 44/00; E21B 2200/20; G06F 30/20; G01V 99/005
USPC .......................................................... 703/10
See application file for complete search history.

(56) References Cited

U.S. PATENT DOCUMENTS

| | | | | |
|---|---|---|---|---|
| 2011/0259598 | A1* | 10/2011 | Hilliard | G06T 19/00 166/369 |
| 2011/0313745 | A1* | 12/2011 | Mezghani | G06K 19/07345 703/10 |
| 2012/0136641 | A1* | 5/2012 | Fung | G06F 30/23 703/10 |
| 2013/0275106 | A1* | 10/2013 | Li | G01V 11/00 703/10 |
| 2014/0236559 | A1* | 8/2014 | Fung | G01V 99/005 703/10 |
| 2015/0260016 | A1* | 9/2015 | Fung | G01V 99/005 703/10 |
| 2015/0260017 | A1* | 9/2015 | Ding | E21B 43/00 703/10 |

(Continued)

FOREIGN PATENT DOCUMENTS

WO    1999057418 A1    11/1999

OTHER PUBLICATIONS

Fung et al. ("An Unstructured Gridding Method for Densely-Spaced Complex Wells in Full-Field Reservoir Simulation") (Year: 2013).*

(Continued)

*Primary Examiner* — Brian S Cook
(74) *Attorney, Agent, or Firm* — Bracewell LLP; Constance G. Rhebergen; Brian H. Tompkins

(57) ABSTRACT

An unstructured grid model with actual well trajectory of individual multilateral wells of a subsurface reservoir is formed. Well trajectory data obtained during drilling of the wells and corresponding to well trajectory data stored as a structured grid model is provided as an input data set for unstructured grid simulation. The unstructured grid model may be formed in a computerized mainframe processor system, or by parallel reservoir simulation by processor nodes of a multicore processor of parallel processor nodes synchronized and under control of a master node.

15 Claims, 9 Drawing Sheets

(56) References Cited

U.S. PATENT DOCUMENTS

| | | | |
|---|---|---|---|
| 2018/0096059 A1* | 4/2018 | Frank | G06F 16/353 |
| 2018/0232950 A1* | 8/2018 | Brewer | G01V 99/005 |
| 2018/0347320 A1* | 12/2018 | Renaudeau | E21B 49/00 |

OTHER PUBLICATIONS

Forouzanfar ("Well-placement optimization using a derivative-free method") (Year: 2013).*

Al-Zahrani ("Automatic Well Completions and Reservoir Grid Data Quality Assurance for Reservoir Simulation Model" (Year: 2015).*

Artus ("Simulation of Deviated Wells Using 3D Unstructured Grids of Flexible Resolution" (Year: 2017).*

Manzoor et al. ("Interior boundary-aligned unstructured grid generation and cell-centered versus vertex-centered CVD-MPFA performance" (Year: 2018).*

Fung, L.S.K., et al.; "Unconstrained Voronoi Grids for Densely Spaced Complex Wells in Full-Field Reservoir Simulation", SPE 163648, Oct. 2014 SPE Journal, vol. 19, No. 5; pp. 803-815.

International Search Report and Written Opinion for PCT application No. PCT/US2020/029939 dated Jul. 27, 2020.

Colleen A. Barton et al, "Fluid Flow Along Potentially Active Faults in Crystalline Rock", 1995, Dept of Geophysics, Stanford University, Stanford, CA, Geology, Aug. 1995, v. 23, No. 8, pp. 683-686.

Ki-Bok Min et al, "Stress-Dependent Permeability of Fractured Rock Masses: A Numerical Study", Engineering Geology and Geophysics Research Group, Royal Institute of Technology (KTH), Stockholm, Sweden, Earth Sciences Division, Berkeley, CA.

Qinghua Lei et al "The Use of Discrete Fracture Networks for Modelling Coupled Geomechanical and Hydrological Behaviour of Fractured Rocks", 2017, Computers and Geotechnics 85, pp. 151-176.

Stephen F. Rogers, "Critical Stress-Related Permeability in Fractured Rocks", 2003, Geoscience World, McLean, VA.

* cited by examiner

RESERVOIR SIMULATION MODELING WITH WELL TRAJECTORY AT TRUE POSITIONS IN GRID SIMULATION MODELS

BACKGROUND OF THE INVENTION

1. Field of the Invention

The present application relates to modeling in reservoir simulation, and more particularly, reservoir simulation modeling by structured grid simulation models with well trajectories at true positions in the models.

2. Description of the Related Art

Oil, gas, and other natural resources are used for numerous energy and material purposes. A reservoir in a geologic body or other formation may contain oil, natural gas, water, and several constituent compounds. Reservoir simulation refers to the modeling of such components to predict the multiphase fluid flow and transport processes in the reservoir. Reservoir simulations may be run before, during, or after a well is drilled to determine the viability of the well, the production rate, and so on. With the advancement of drilling technology, wells having multiple lateral wells in a particularly productive geologic strata and highly complex geometries are increasingly being deployed in some reservoirs. In order to enhance production and other processes in these reservoirs, the accuracy of flow modeling and other techniques has presented numerous challenges and increased difficulty. Moreover, the accuracy of flow modeling and other simulation techniques may affect the performance prediction for wells in these reservoirs and the ultimate decision to extract the natural resources.

Reservoir simulation of fluid flow over production life in the reservoir layers is the primary tool used by the oil industry for the planning and development of subterranean hydrocarbon reservoirs. For reservoir simulation, the subsurface reservoir is organized into a 3-dimensional grid model. The grid model may be organized as either a structured grid or an unstructured grid. In a structured grid, the reservoir is partitioned into 3-dimensional rectangular or cubic grid cells located according to the Cartesian coordinates of the X and Y coordinates in a horizontal plane and Z coordinates in a depth or vertical plane. During drilling of wells into the reservoir, the position of the drill bit is electronically monitored and recorded in 3-dimensional Cartesian coordinates by surface instrumentation. Seismic data available from seismic surveys of the earth in the region of the reservoir are obtained and arranged in 3-dimensional Cartesian coordinates. Further, geological models of the subsurface formation rock and its characteristics and nature are obtained and arranged in 3 dimensional Cartesian coordinates.

In an unstructured grid, the grid cells are located at particular grid points of interest in the reservoir to take into account the position of wells in the reservoir and to take into account and align the grid cell edges with well paths as an internal boundary in the reservoir. An internal boundary can also be a fault plane or another type of discontinuity within the model. Other such types of internal boundary discontinuities may include, for example, fractures or other forms of discontinuity in nature, such as boundaries for geological facies or hydraulic units.

A reservoir may have one or multiple complex irregular and intersecting internal boundaries of both wells and discontinuities. The accurate modeling of fluid flow and transport near these internal boundaries in reservoir simulation is an important consideration. Commonly owned U.S. Patent Application Publication No. 2015/0260016, "Modeling Intersecting Faults and Complex Wellbores in Reservoir Simulation" (SA5262), relates to techniques for forming unstructured grid simulation models for reservoirs having wells as internal boundaries. U.S. Patent Application Publication No. 2015/0260017, "Generating Unconstrained Voronoi Grids in a Domain Containing Complex Internal Boundaries" (SA5263), relates to techniques for forming unstructured grid simulation models for reservoirs having discontinuities as internal boundaries.

Flow of multiphase fluid (oil, water/brine and gas) in permeable rock formation layers into wells during production is governed by fluid pressures and saturations in the formation rock. The flow is governed by the physical principle of mass conservation and reservoir simulation forms measures of this flow between adjacent cells in the grid model over a series of time steps. The relation between flow, pressure and saturation in the cells is expressed in complex, non-linear partial differential equations. These types of equations are not susceptible to analytical solution. Instead, reservoir simulation of the flow of the fluids in the reservoir is performed by computer processing with the numerical solution techniques. The complexity of the numerical solutions and a large number of grid cells result in the reservoir simulation being a computationally intensive and time consuming process.

The reservoirs and layers are organized into grid simulation models. Either in a structured grid or an unstructured grid. With the advancement of drilling technology, wellbores having multiple lateral wells and complex geometries are increasingly being deployed in order to enhance production and injection processes in these reservoirs.

Complex wellbores, many having several multilateral wells, are increasingly drilled in producing layers of the reservoir to more optimally exploit the hydrocarbon resources. Most reservoirs and fields also have internal discontinuities such as faults, large fractures, and hydraulic unit boundaries. The simulation models need to represent those internal discontinuities. Existing simulation technology using structured grids or CPG grids cannot represent these complex internal geometry and boundaries adequately.

Part of unstructured grid modeling process is to compare the initial structured grid simulation with the converted unstructured grid simulation. Traditionally, the well trajectory data used in the unstructured grid model is supposed to be from the well database as a provided measured true well coordinates and depth of the well. However, the well coordinates and depth data has not, so far as is known, been consistently correlated by the well trajectory data used in the structured grid model. Such data inconsistencies can have a significant impact on the well production performance during the simulation. Further simulation comparison between the structured and unstructured grid simulations has been difficult and time-consuming.

SUMMARY OF THE INVENTION

Briefly, the present invention provides a new and improved method of generating an unstructured grid model with actual well trajectory of at least one individual well of a plurality of wells of a subsurface reservoir during reservoir simulation. The reservoir simulation is performed by a computer having a memory and a processor. Generation of the model is based on input data provided the computer define internal boundary geometry and internal boundary descriptions of the reservoir model. Generation of the model is also based on well trajectory and completion data for the wells in the reservoir obtained during drilling of the wells.

Generation of the unstructured model with actual well trajectory according to the present invention is performed by storing in the memory computer, operable instructions causing a processor to generate the unstructured grid with actual well trajectory of at least one individual well during the reservoir simulation. The processor under control of the stored computer operable instructions then performs steps including receiving from the memory well perforation location coordinates of the wells in a structured grid model of the reservoir based on the well trajectory and completion data for the wells, and obtaining well perforation location coordinates for the well branches of the at least one individual well during a during drilling of the well branches.

The obtained well perforation location coordinates are assembled for the well branches of the individual well, and an interpolated well trajectory is formed for the individual well by interpolation of a wellbore path between the assembled well perforation location coordinates for the well branches of the individual well. The unstructured grid model of the reservoir including the interpolated well trajectory for the individual well is then formed.

The present invention also provides a new and improved data processing system to generate an unstructured grid model with actual well trajectory of wells of a subsurface reservoir during reservoir simulation based on input data defining internal boundary geometry and internal boundary descriptions of the reservoir model, and on well trajectory and completion data for the wells in the reservoir obtained during drilling of the wells.

The data processing system includes a reservoir simulator module performing the reservoir simulation and forming a structured grid model of the reservoir, and an unstructured gridding module forming the unstructured grid for the unstructured grid model of the reservoir. The data processing system also includes a memory storing computer operable instructions to generate the unstructured grid with actual well trajectory of at least one individual well during the reservoir simulation. The memory also stores the input data defining internal boundary geometry and internal boundary descriptions of the reservoir model, and the well trajectory and completion data for the wells in the reservoir obtained during drilling of the wells.

The data processing system also includes a processor performing under control of the stored computer operable instructions to receive from the memory well perforation location coordinates of the wells in a structured grid model of the reservoir based on the well trajectory and completion data for the wells. The processor obtains well perforation location coordinates for the well branches of the well during drilling of the well branches, and assembles the obtained well perforation location coordinates for the well branches of the individual well.

The processor then forms an interpolated well trajectory for the individual well by interpolation of a wellbore path between the assembled well perforation location coordinates for the well branches of the individual well, and forms the unstructured grid model of the reservoir including the interpolated well trajectory for the individual well.

The present invention also provides a new and improved data storage device having stored in a non-transitory computer readable medium computer operable instructions. The instructions cause a data processing system to generate an unstructured grid model with actual well trajectory of wells of a subsurface reservoir during reservoir simulation by a reservoir simulator of a computer which includes a memory and a processor. The generation of the model is based on input data defining internal boundary geometry and internal boundary descriptions of the reservoir model provided the computer, and on well trajectory and completion data for the wells in the reservoir obtained during drilling of the wells. The instructions stored in the data storage device cause the data processing system to store in the memory computer operable instructions causing the processor to generate the unstructured grid with actual well trajectory of at least one individual well during the reservoir simulation.

The instructions cause the processor under control of the stored computer operable instructions to receive from the memory well perforation location coordinates of the wells in a structured grid model of the reservoir based on the well trajectory and completion data for the wells. The instructions further cause the processor to obtain well perforation location coordinates for the well branches of the one well during drilling of the well branches.

The instructions then cause the processor under control of the stored computer operable instructions to assemble the obtained well perforation location coordinates for the well branches of the individual well, and to form an interpolated well trajectory for the individual well by interpolation of a wellbore path between the assembled well perforation location coordinates for the well branches of the individual well. The instructions then cause the processor to form the unstructured grid model of the reservoir including the interpolated well trajectory for the individual well.

DETAILED DESCRIPTION OF THE PREFERRED EMBODIMENTS

Figure 1:
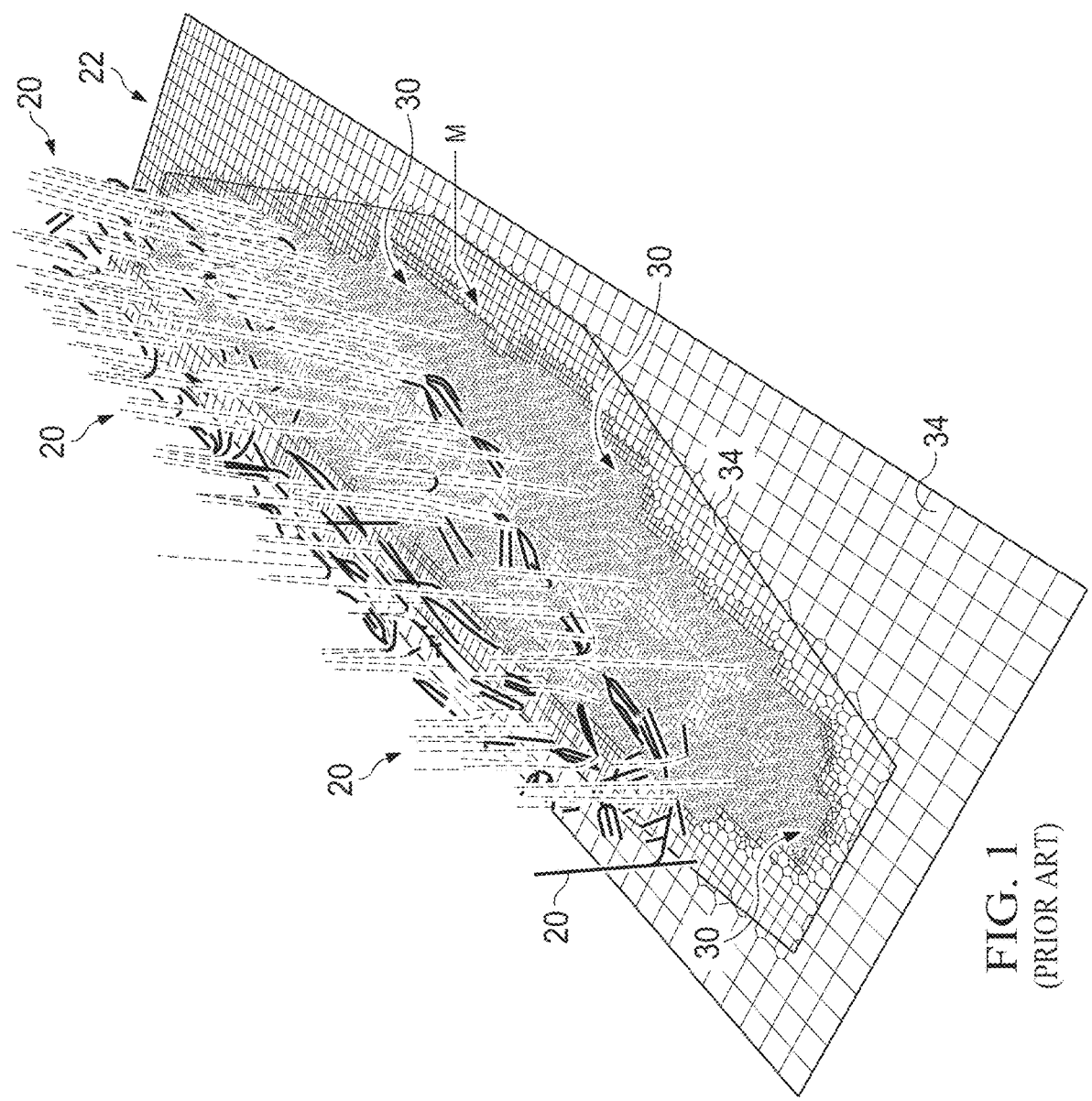
FIG. 1 is an isometric view of a prior art 3-dimensional unstructured grid reservoir model of a producing reservoir with multiple present wells and contemplated wells.

In the drawings, the letter M (FIG. 1) designates generally a 3-dimensional unstructured large-scale grid model of a very large producing hydrocarbon reservoir. Reservoir models such as shown at M in FIG. 1 are the basis for reservoir simulation to form projections or estimates of the production of fluids from the reservoir over a projected production life of the reservoir.

As indicated, there are usually hundreds of wells 20 drilled and completed into the reservoir into one or more generally laterally extending layers 22. Typically, there are multiple such layers 22 in a producing reservoir being modeled. Only one such layer 22 is shown in the drawings in order to preserve clarity.

Figure 2:
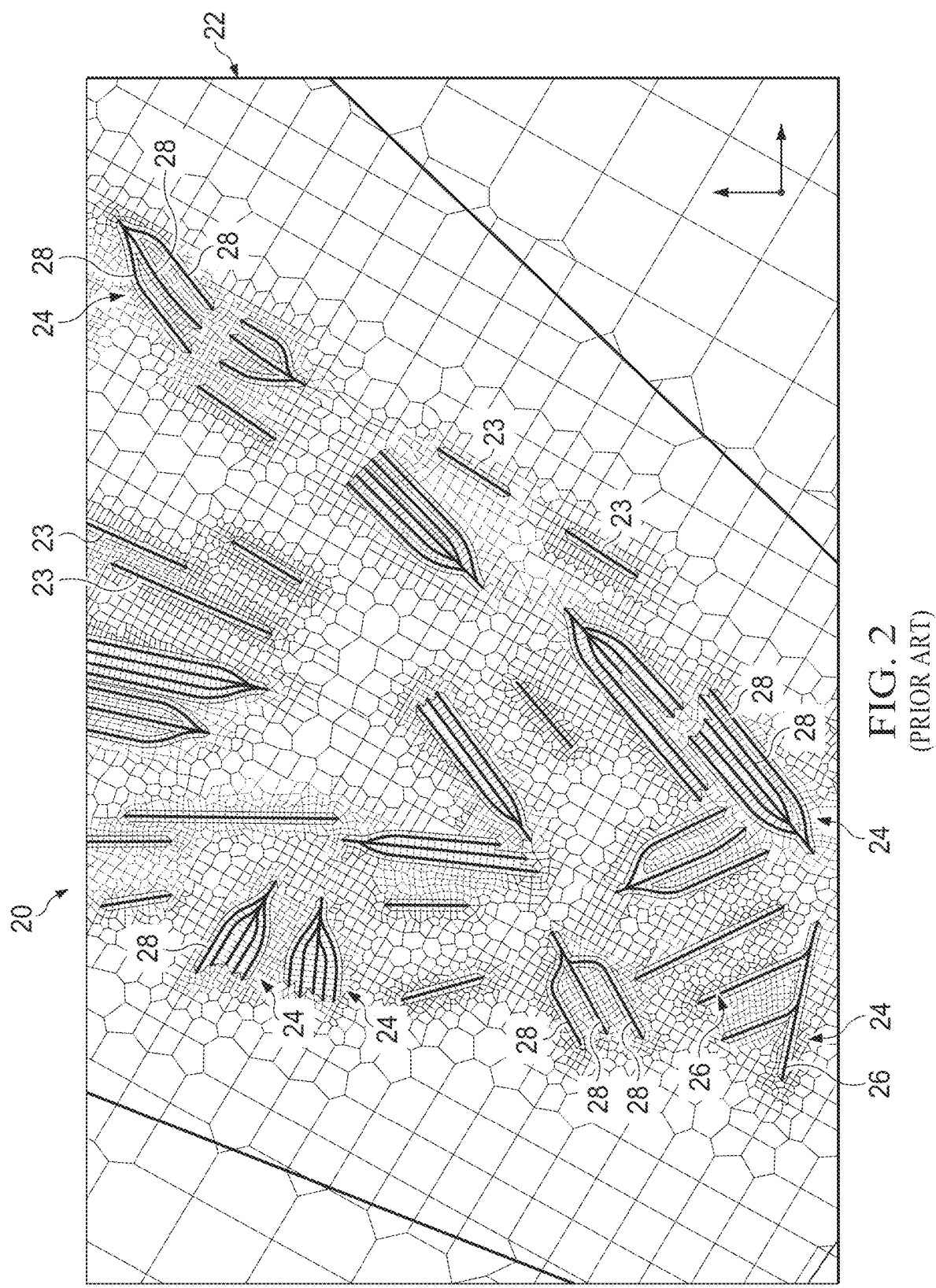
FIG. 2 is an isometric view of a 2-dimensional unstructured grid model of a layer in the prior art 3-dimensional unstructured grid reservoir model of FIG. 1.

The wells 20 may be drilled and completed wells productive of hydrocarbons, or may be injection wells used to introduce fluids into the reservoir for reservoir management, such as increased production or enhanced recovery. The model M may also include locations of planned wells 20 scheduled to be drilled but not yet drilled. FIG. 2 is a plan view of a portion of layer 22 illustrating the location of wells 20. Recently, it has been increasingly prevalent where feasible to drill horizontal wells 23 which extend laterally at a depth of interest from a vertical or other well 20 (FIG. 1) into a formation layer such as shown at 22.

Figure 5:
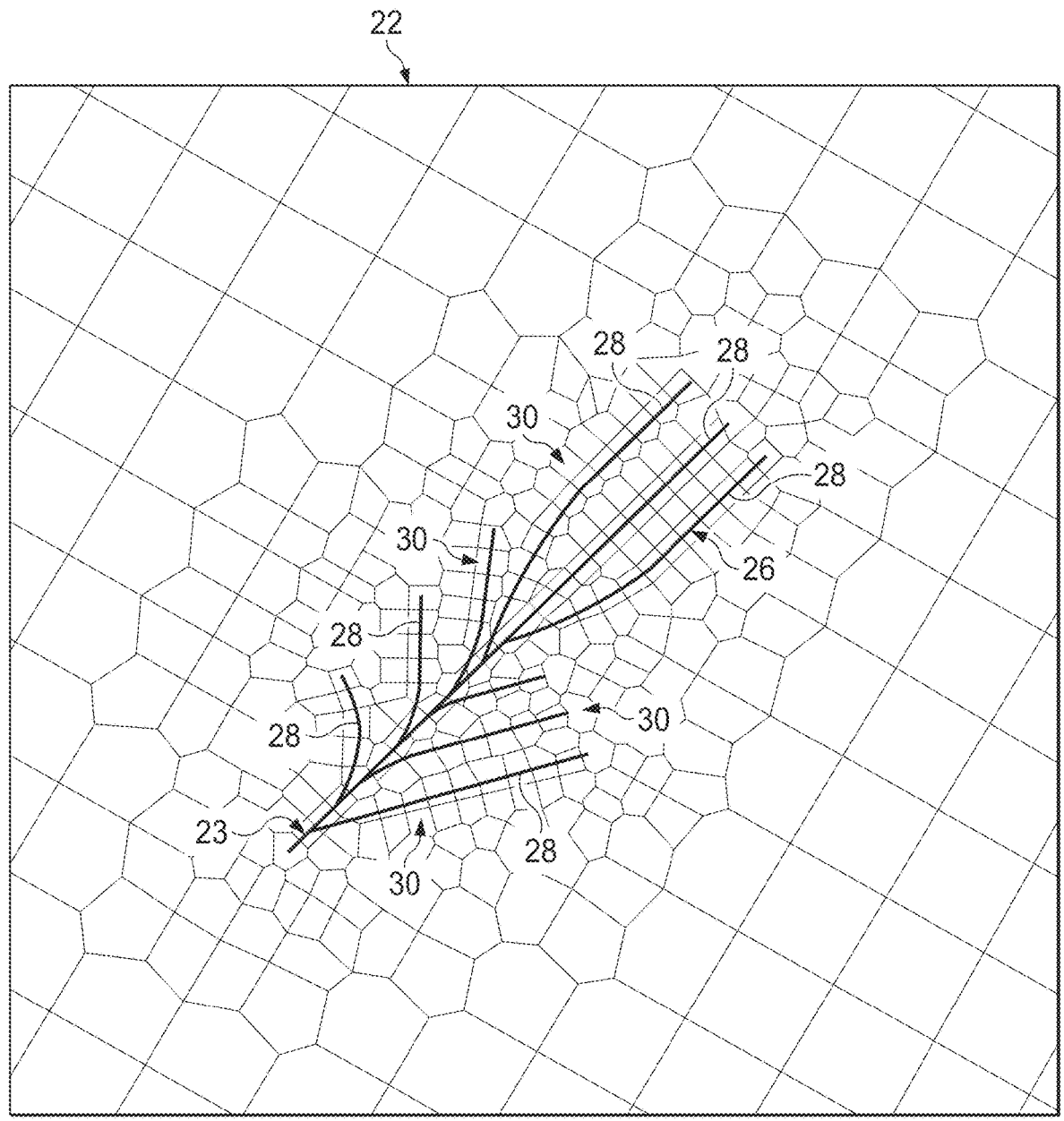
FIG. 5 is an enlarged view of a 3-dimensional unstructured grid model with a multilateral well present.

As indicated at 24, a number of the horizontal wells in a single layer 22 are also expanded by additional drilling of multiple branches 26 in the form of well paths 28 extending outwardly from horizontal wells 23 into the layer 22. FIG. 5 illustrates schematically a multilateral horizontal well 23 having multiple branches 26 in the form of well paths 28 superimposed over layer 22 of the unstructured grid model M.

In an unstructured reservoir grid model, the term "unstructured" refers to a grid as having cells with an irregular pattern or no fixed topology pattern. An advantage of an unstructured grid is that the irregular or no fixed topology pattern permits the reservoir grid model to conform to the irregular geological internal boundaries in the reservoir. An unstructured grid is formed by generating grid points on geometry with a suitable shape, rather than being constrained to fixed 3-dimensional Cartesian coordinate grids. An unstructured grid cell model is generated on top of irregular well geometry and hence the well geometry can be modeled at its true locations in the reservoir.

In the unstructured grid model M (FIG. 1), grid cells 30 are located at particular grid points of interest in the reservoir to take into account the position of wells 20 in the reservoir and to take into account and align the grid cells 30 with well paths 28 as an internal boundary in the reservoir. This is indicated schematically in FIG. 5. An internal boundary can also be a fault plane or another type of discontinuity within the model. The unstructured grid reservoir model M is surrounded as indicated at 34 (FIG. 1) by aquifers in the outer regions. The aquifer subsurface regions contain almost entirely water/brine, and consequently are not of particular interest for the purposes of hydrocarbon production. Accordingly, these portions 34 of the grid model M in FIG. 1 may be arranged in rectangular grid cells having Cartesian coordinates as is the case in a structured grid.

Figure 3:
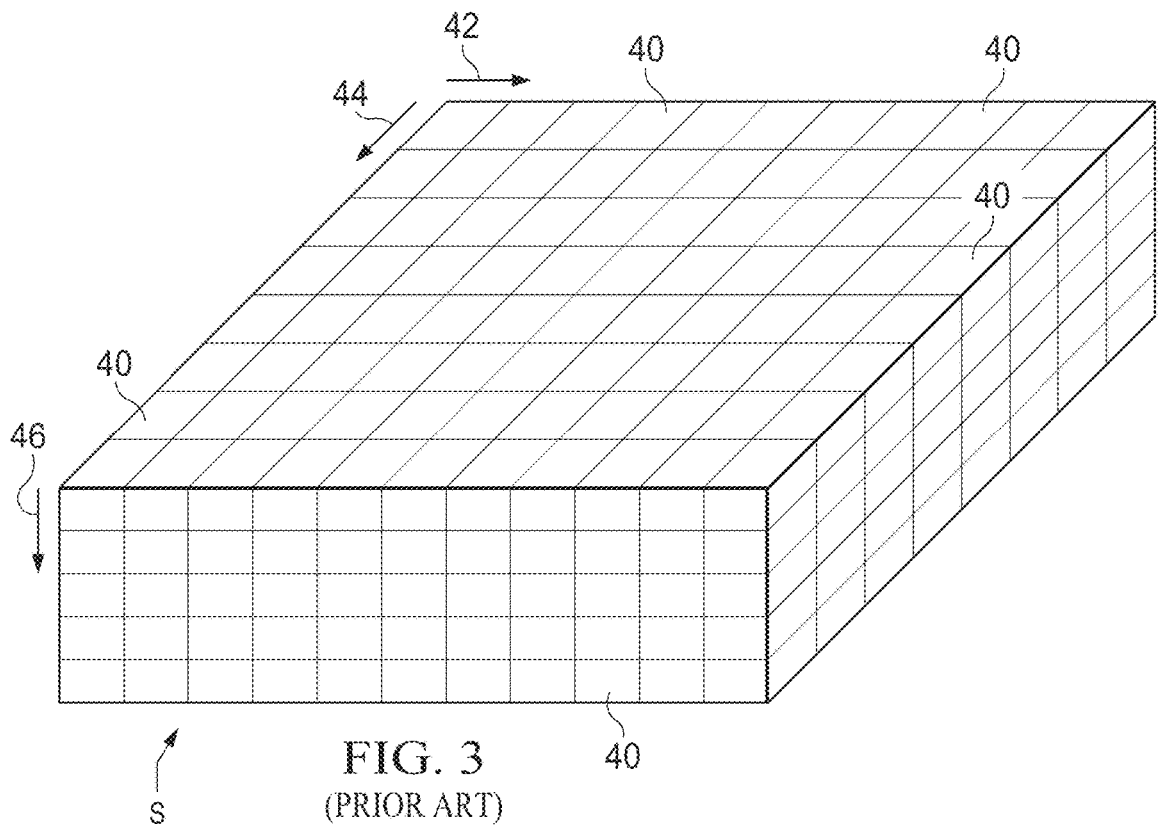
FIG. 3 is an isometric view of a prior art 3-dimensional structured grid model of grid cells.

In a structured grid S (FIG. 3), the reservoir is partitioned into 3-dimensional array of rectangular or cubic grid cells 40 located according to Cartesian X and Y coordinates along a first horizontal or X axis 42 and a second horizontal or Y axis 44 arranged in a horizontal plane and vertical coordinates along a vertically extending or Z axis 46 in a depth or vertical plane. During drilling of wells into the reservoir, the position of the drill bit is electronically monitored and recorded in 3-dimensional Cartesian coordinates by surface instrumentation. Seismic data available from seismic surveys of the earth in the region of the reservoir are obtained and arranged in 3-dimensional Cartesian coordinates. Further, geological models of the subsurface formation rock and its characteristics and nature are obtained and arranged in 3-dimensional Cartesian coordinates. Thus, a number of types of data concerning the reservoir of interest are collected and stored in 3-dimensional Cartesian coordinates.

However, the Cartesian grid system of a structured grid model with fixed cell sizes and connectivity between adjacent grid cells does not permit interpolation of well trajectories in the reservoir. Approximated well locations are used to represent well trajectory in the structured grid model. This is despite the actual position and location of the well in the reservoir according to its X, Y and Z coordinates being obtained and recorded during the drilling of a well.

Figure 4:
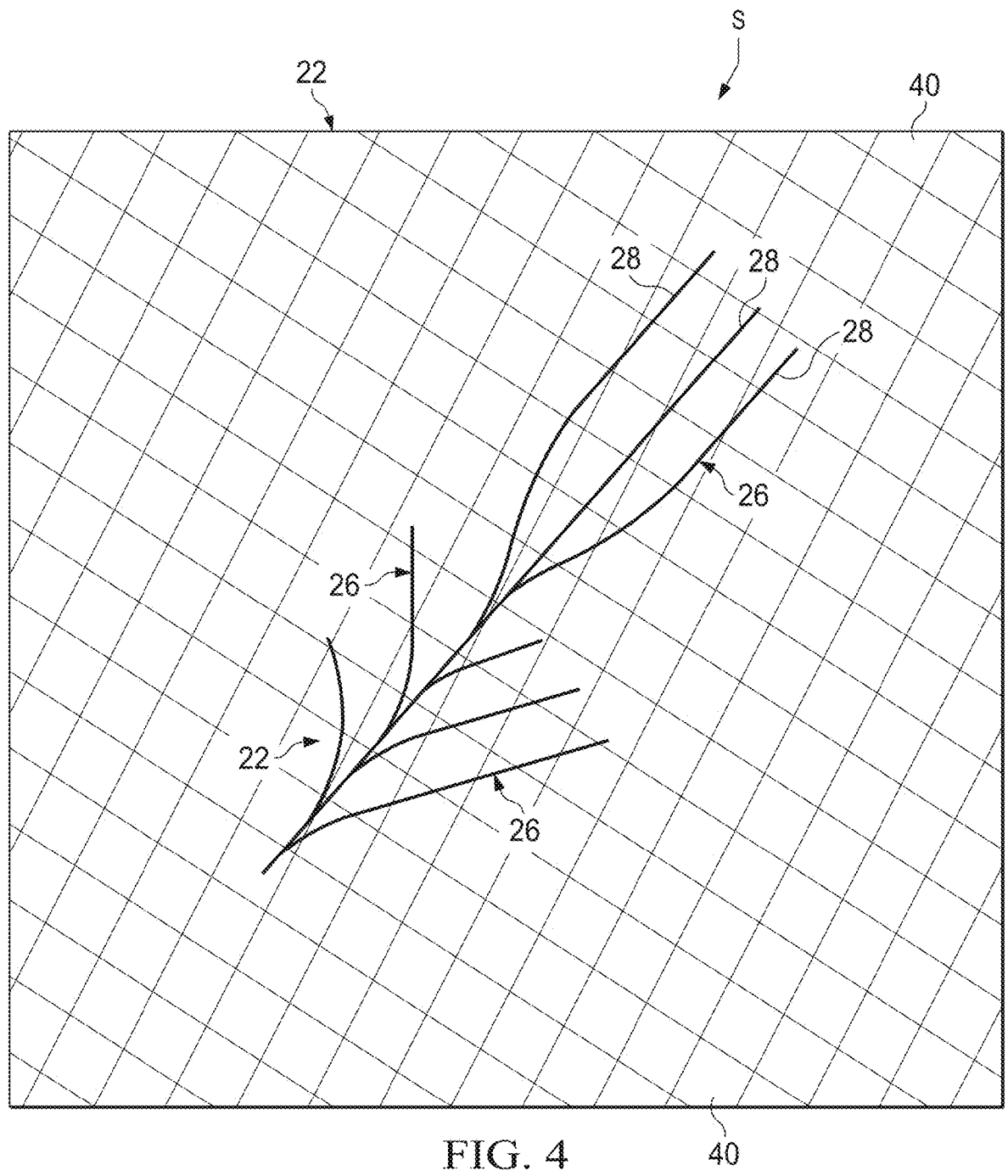
FIG. 4 is an enlarged view of a portion of a layer of a 3-dimensional structured grid model of FIG. 3 with a multilateral well present.

FIG. 4 illustrates schematically a multilateral well 22 having multiple branches 26 in the form of well paths 28 superimposed over a layer 22 of grid cells 40 of the structured grid model S. The actual well path or trajectory in the earth and its 3-dimensional coordinates in the earth are obtained by instrumentation during drilling, and stored as a part of a well database, as will be described in connection with the processing according to the present invention.

In the structured grid model S shown in FIG. 4, the location in the Cartesian coordinate grid cells 40 of the actual well path or trajectory is not shown. With a structured grid model, the Cartesian coordinates of the well trajectory are constrained to follow the rectilinear boundaries of the grid cells. This results in the well paths in the structured grid model S having the form of what is known as a zigzag pattern along the grid cell boundaries.

One component of an unstructured reservoir grid modeling process is to compare the initial structured grid simulation with the converted unstructured grid simulation. Traditionally, the well trajectory data input for the unstructured grid model has been treated as if it were the same as the well trajectory from the data stored as the well database. However, this is typically not the case. One problem is that the well trajectory data exported from geological modeling software can have additional, missing or deviated segments that are not present in the actual well trajectory data obtained during drilling database. This may occur for any of several reasons, such as fixing bias in the well database or some other modeling considerations. Such inconsistent data set in the two models makes the simulation comparison difficult.

On the other hand, a structured grid model uses the Cartesian type of grid with fixed neighbor connectivity. A structured grid model thus has to use approximated well locations to represent the well trajectory in the model.

The present invention provides a methodology for incorporating the true physical location well trajectory data in the well database, representing is the measured true well coordinate and depth, as well location input coordinates for the unstructured grid model of the reservoir simulation. This is one of the main components when converting an existing structured grid model to an unstructured grid during reservoir simulation. During the model conversion process, the geological properties and simulation parameters in the structured grid model are duplicated in the converted unstructured grid model with the exception of the well trajectory data being loaded in from well database.

As a common practice in unstructured grid modeling, a comparison of the converted unstructured grid model against the initial structured grid simulation is regularly conducted. Well production differences between the structured and unstructured grid models have been observed during reservoir simulation with the models. With the present invention, it has been found that well trajectory data in well databases are not being consistently correlated with the well trajectory data used in the structured grid model. One typical issue has been that the well trajectory data exported from geological modeling software can have additional, missing or deviated segments when compared with well trajectory data from the well database. The altered segments in the well trajectory data can be due to many reasons, such as fixing bias in the well database or some other particular modeling considerations. Inconsistencies regarding the well trajectory between the structured and unstructured grid models make the simulation comparison difficult.

To overcome the model comparison difficulties, the simulation input data is, according to the present invention, conformed between the structured and unstructured grid models so that the well data in them can be comparable and consistent. The present invention provides a new and improved methodology to integrate and interpolate the well trajectory data in the structured grid simulation model and construct well trajectory data as input for unstructured grid simulation. As the well trajectory data in the structured grid model is represented as zigzag approximation, interpolation and smoothing is applied to the data points. The present invention thus provides a capability to generate an accurate actual well trajectory ready for an unstructured grid model.

Figure 7:
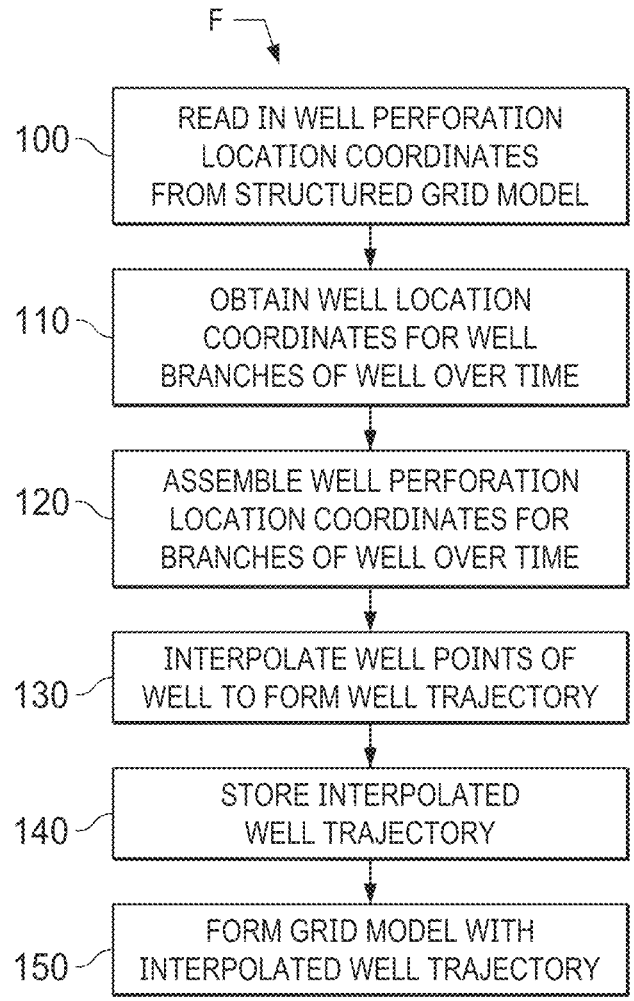
FIG. 7 is a functional block diagram or flow chart of computer processing steps for generating well trajectory at its true location in a 3-dimensional structured grid model according to the present invention.

A flow chart F (FIG. 7) illustrates the basic computer processing sequence performed by a data processing system D (FIG. 10) for reservoir simulation modeling with well trajectory at true positions in grid simulation models according to the present invention. Flow chart F shows the computational methodology taking place during a typical embodiment of well trajectory grid on modeling during reservoir simulation according to the present invention.

As shown at step 100, actual well perforation location coordinates obtained and stored in the well database 212 in memory 204 or 216 of the data processing system D. These coordinates are obtained as a result of monitoring the drilling of the well are read in as well perforation data during data preparation for processing in the data processing system D.

During step 110, well location coordinates for well branches 26 of wells 22 of interest over time during drilling are obtained by sorting the well perforation data based on individual lateral well(s) 22, branch wells 26 of the individual lateral well(s), their lateral well paths 28 and the relevant time interval. The well perforation data is provided at particular time when a well branch is opened/perforated, so the well data is obtained and stored with respect to the well branch and perforated time.

The stored well branch data for individual ones of the multilateral wells formed during drilling of the well branches of the reservoir are integrated during step 120. This produces full trajectory data of the individual multilateral wells for the appropriate time intervals of interest. The production of three dimensional coordinates of trajectory of the wells from the well location and well perforation obtained during drilling may be performed in several ways. Examples includes either or both of U. S. Patent Application Publication Nos. 2014/0236559, "Systems, Methods, and Computer-Readable Media for Modeling Complex Wellbores in Field Scale Reservoir Simulation"; 2015/0260016, "Modeling Intersecting Faults and Wellbores in Reservoir Simulation." It should be understood that other methodologies may also be used.

Figure 8:
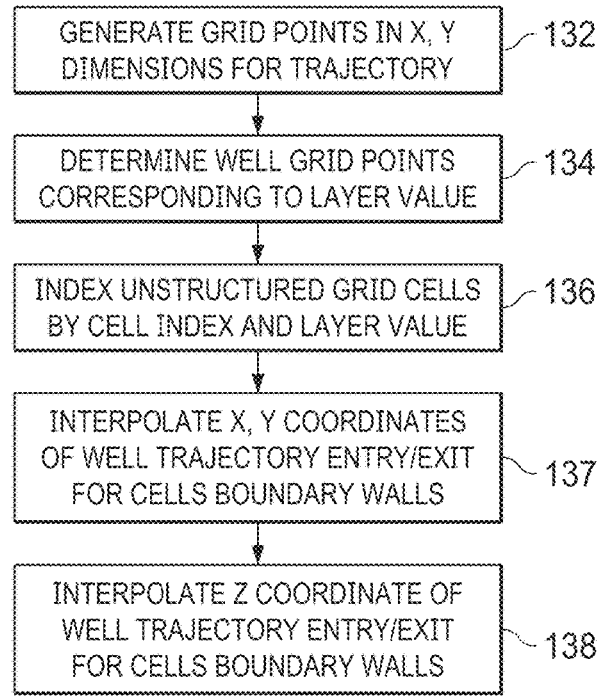
FIG. 8 is a more detailed functional block diagram of a portion of the functional block diagram of FIG. 7.
Figure 9A:
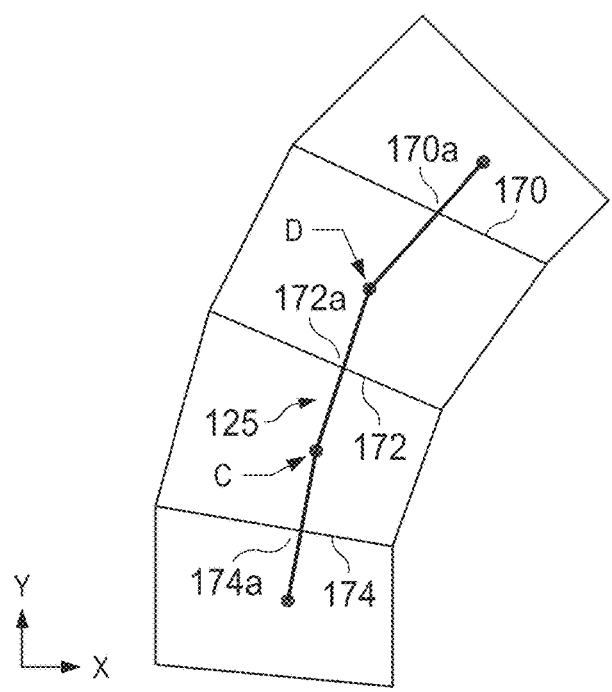
FIG. 9A is an enlarged schematic diagram in a horizontal plane of x, y coordinates for example well perforation locations in a 3-dimensional structured grid model of a reservoir according to the present invention.
Figure 9B:
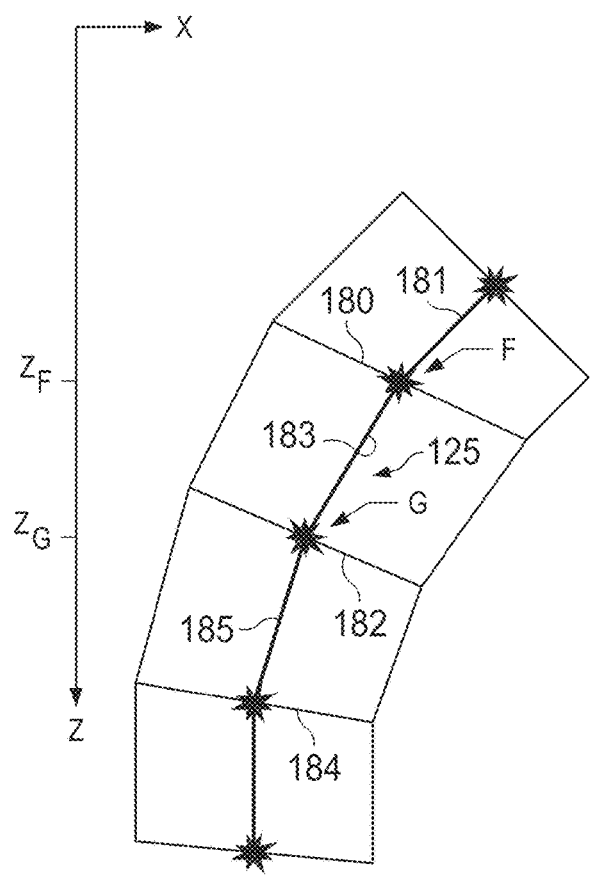
FIG. 9B is an enlarged schematic diagram in a vertical plane of x, z coordinates for example well perforation locations in a 3-dimensional structured grid model of a reservoir according to the present invention.

Step 130 involves interpolation on a full multilateral well trajectory for individual multilateral wells. The interpolation when performed, provides a smooth well trajectory through the grid cells of the reservoir model. Details of the interpolation performed during step 130 are illustrated in FIG. 8. The well trajectory interpolation is illustrated schematically in an example model of a well trajectory 125 are shown in FIGS. 9A and 9B.

Interpolation of the well trajectory begins the actual well perforation location coordinates of the well trajectory 125. A step 132 (FIG. 8) is performed to generate grid points in the X, Y dimensions (FIG. 9A) for the well trajectory 125 in a horizontal plane. Example generated grid points are indicated schematically at C and D. The location of the points C and D in the X, Y or horizontal plane is controlled by user-defined gridding spacing requirements for the reservoir model being formed. The grid points C and D are located at cell center locations of an unstructured grid being generated. Also shown in FIG. 9A are lines 170, 172 and 174 indicating schematically the location and extent in a horizontal X, Y plane of vertical side walls of representative grid cells for a model to be formed based on defined grid spacing for the model.

The side walls as indicated at 170a, 172a and 174a are intersected in the X, Y plane (FIG. 9A) by entry/exit of well trajectory 125. FIG. 9A thus illustrates at grid locations C and D in a horizontal plane of the X, Y coordinates of the location of the well trajectory 125 in the reservoir model to be formed.

During a step 134, the well grid points are determined corresponding to a layer value assigned to a layer where the well trajectory 125 is present. These well grid points are indicated schematically at grid points C and D in FIG. 9A. During step 134, track is also kept by storing or retaining an approximated layer value for grid points on the well trajectory 125. An example of an approximated layer value, for grid points on the well trajectory within a layer such as 9.1, or 9.6, is saved or stored for interpolating the well trajectory 2-dimensional grid point in layer 9. Retaining an approximate layer value provides an ability to interpolate the layer value for the well grid point. For two well trajectories having a grid point at a common cell, each well may have a different layer value.

Step 136 involves indexing the unstructured grid cells by cell index and layer value. Subsequently in step 137, the X, Z coordinates of well trajectory entry/exit for cell boundary walls such as shown at 180, 182 and 184 for the well trajectory 125 in a vertical plane (FIG. 9B) are interpolated. Examples of the interpolated X, Z coordinates for well trajectory 125 are shown at points F and G in FIG. 9B. Step 138 follows and involves interpolation of Z coordinates of well trajectory 125 entry/exit for the cell boundary walls 180, 182 and 184 of the unstructured grid cells to be formed.

FIG. 9B illustrates schematically an interpolation in the vertical plane of locations in reservoir coordinates of interpolation lines 181, 183, 185 formed intersecting in the Z or vertical plane lines the cell boundary walls 180, 182 and 184 of grid cells. Again, the cell boundary walls and their extent and location are representative of a user specified grid spacing for the reservoir model being formed. The grid points F and G in FIG. 9B represent in the vertical or X, Z plane illustrative depth values $Z_F$ and $Z_G$ of the entry/exit point of the top/bottom of the location of the well trajectory 125 in the reservoir model to be formed.

Step 140 is providing of an output of the results of the well trajectory interpolation during step 138 of the x, y and z coordinates of the well trajectory obtained during drilling. The interpolation results are stored in memory of the data processing system D during step 140. The resultant interpolated well trajectory is then transferred from memory of the data processing system for generating an unstructured reservoir grid model during step 150 with well trajectory locations conforming to those obtained as a result of drilling the well.

Figure 6:
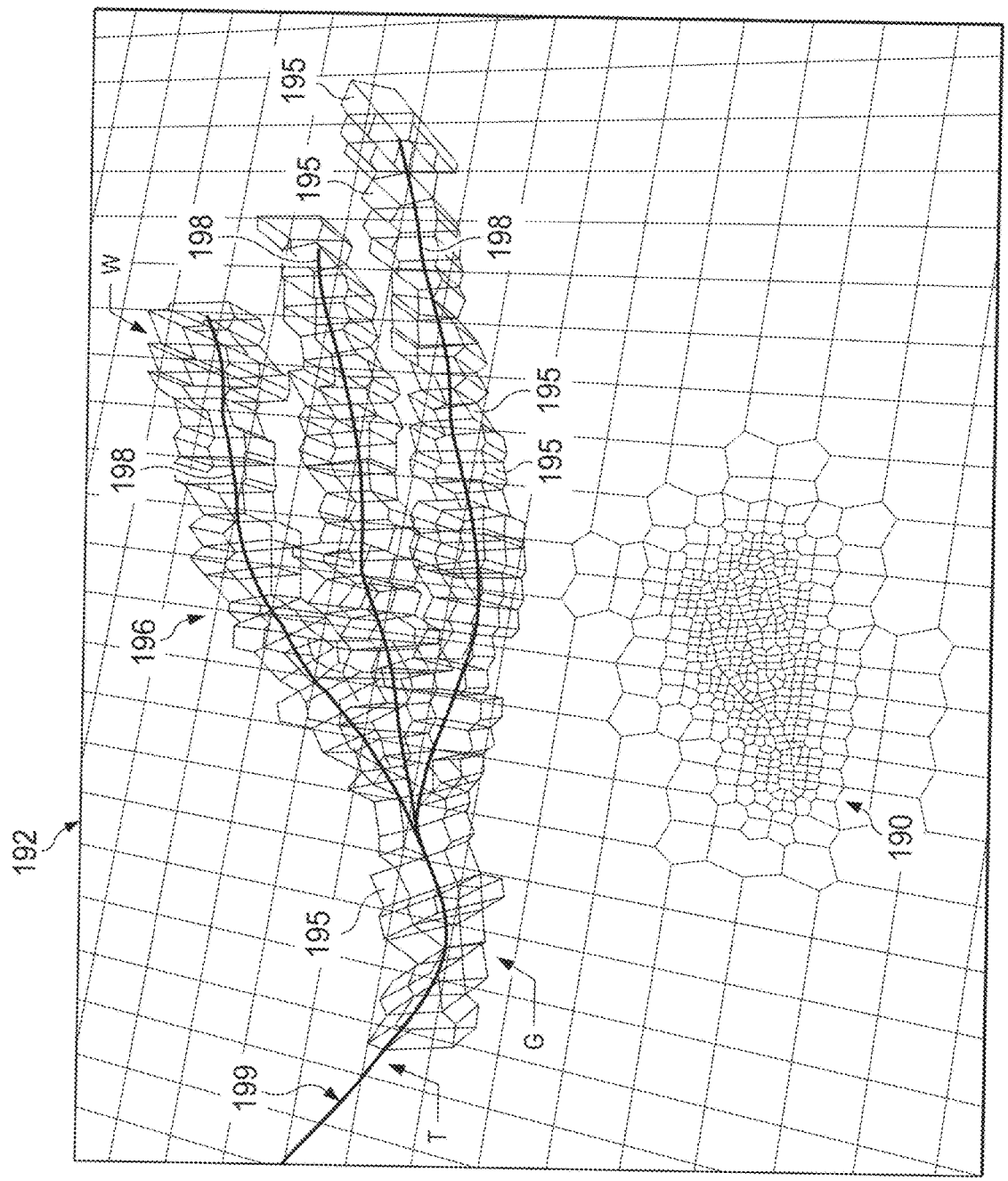
FIG. 6 is an isometric view of an enlarged portion of a 3-dimensional unstructured grid model of a multilateral well according to the present invention.

In FIG. 6, a 3-dimensional unstructured grid model G of a multilateral well W with a well trajectory T according to the present invention is shown in an exploded, enlarged isometric view. The model G is shown above a representation at 190 of the same multilateral well in layer 192 in a two dimension plane. The unstructured grid model G is formed of 3-dimensional unstructured grid cells 195 shown in the isometric view. The multilateral well W has, as shown in in the exploded view, multiple branches 196 in the form of well paths 198 from horizontal well 199.

From the foregoing, it can be seen that the present invention interpolates well trajectory data into a structured grid model and builds reservoir simulation models with well trajectory at true positions for unstructured grid simulation. The interpolation methodology generates smooth well trajectories for the unstructured grid model based on the well location coordinates from the well perforation data obtained during drilling of the well. The interpolated well trajectories are significant advantages for reservoir simulation in comparison with the zigzag approximated representation of well trajectory of structured grid models.

The generated well trajectory data from the initial structured grid model provides a comparable data set for the unstructured grid model. Any alternation on well segments in the geological modeling process for structured grid model is kept in the final data set used for unstructured grid. Hence, the well trajectory coordinate difference in the comparison of well trajectory of a structured grid model and the actual well trajectory in well database is no longer applicable. The present invention provides comparable well trajectories for use in both unstructured grid and unstructured grid reservoir models. It is important to have comparably matched unstructured grid simulation results for comparative purposes during initial stages of structured grid simulation.

The present invention resolves the problem of difference or inconsistency between input data when converting a structured grid simulation model to an unstructured grid. The well trajectory data according to the present invention is made to be comparable, even though the original input data of the two models was inconsistent regarding the grid coordinates of the well trajectory.

The present invention utilizes the well trajectory information being used in the initial simulation model. The well trajectory information is in structured grid format. The present invention preserves a well trajectory for unstructured gridding on the same trajectory. The present invention thus provides the well input data consistent between the initial structured grid model and the new model in the form of an unstructured grid model. Before the present invention the unstructured grid simulation had so far as is known used the well information from the database. The well data information in many cases, was different from the well information in the structured grid simulation model.

Data Processing System

Figure 10:
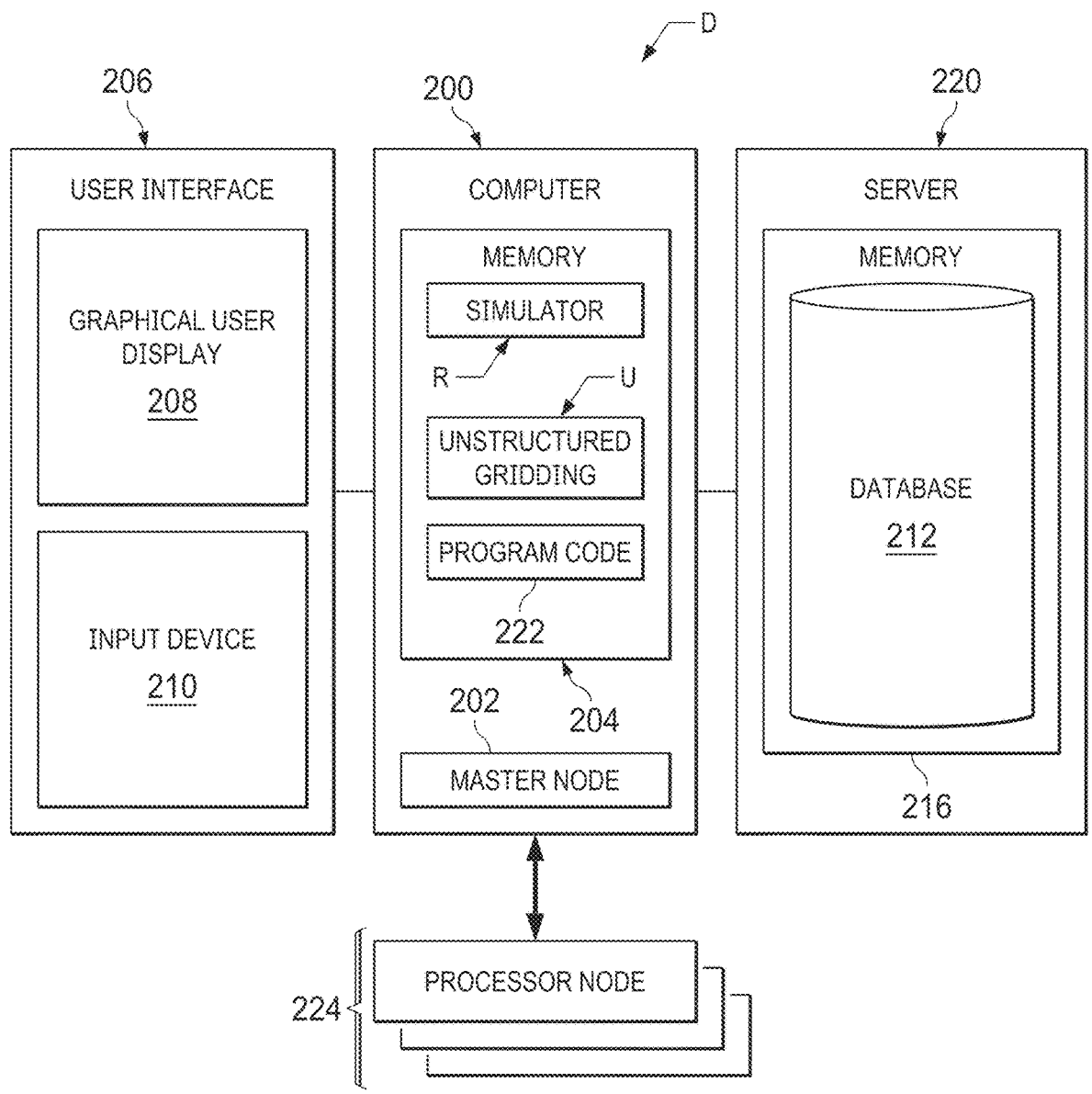
FIG. 10 is a schematic diagram of a computer network for structured and unstructured reservoir grid modeling according to the present invention.

As illustrated in FIG. 10, the data processing system D includes a computer 200 having a master node processor 202 and memory 204 coupled to the master node processor 202 to store operating instructions, control information and database records. The data processing system D is preferably a multicore processor with nodes such as those from Intel Corporation or Advanced Micro Devices (AMD), or an HPC Linux cluster computer. The data processing system D may also be a mainframe computer of any conventional type of suitable processing capacity such as those available from International Business Machines (IBM) of Armonk, N.Y. or other source. The data processing system D may in cases, also be a computer of any conventional type of suitable processing capacity, such as a personal computer, laptop computer, or any other suitable processing apparatus. It should thus be understood that a number of commercially available data processing systems and types of computers may be used for this purpose.

The master node processor 202 is accessible to operators or users through user interface 206 with a conventional input device 210. The user interface 206 also includes an output graphic user display 208 for displaying output data or records of processing results obtained according to the present invention. The output display 204 includes components such as a printer and an output display screen capable of providing printed output information or visible displays in the form of graphs, data sheets, graphical images, data plots, interactive displays, video displays and the like as output records or images.

The master node processor 202 contains a reservoir simulator R. The reservoir simulator R which may, for example, be a reservoir simulator such as those provided under the trademark GigaPOWERS as described in the literature. See, for example articles by Dogru, A. et al, "*A Next-Generation Parallel Reservoir Simulator for Giant Reservoirs*," SPE 119272, Proceedings of the 2009 SPE Reservoir Simulation Symposium, The Woodlands, Tex., USA, Feb. 2-4, 2009 and "*New Frontiers in Large Scale Reservoir Simulation*," SPE 142297, Proceedings of the 2011 SPE Reservoir Simulation Symposium, The Woodlands, Tex., USA, Feb. 21-23, 2011.

The master node processor 202 also contains an unstructured gridding module U of the type described in Applicant's U. S. Patent Application Publication No. 2014/0236559, dated Aug. 21, 2014, "Systems, Methods, and Computer-readable Media for Modeling Complex Wellbores in Field-Scale Reservoir Simulation" (SA5125); or of the type described in Applicant's U. S. Patent Application Publication No. 2015/0260016, dated Sep. 17, 2015, "Modeling Intersecting Faults and Complex Wellbores in Reservoir Simulation" (SA5262).

The user interface 206 of computer 200 also includes a suitable user input device or input/output control unit 208 to provide a user access to control or access information and database records and operate the computer 200. Data processing system D further includes a database 212 of data stored in computer memory, which may be internal memory 204, or an external, networked, or non-networked memory as indicated at 216 in an associated database server 220.

The data processing system D includes program code 222 stored in non-transitory memory 204 of the computer 200. The program code 222 according to the present invention, is in the form of computer operable instructions causing the data master node processor 202 to perform reservoir simulation modeling with well trajectory at true positions in grid simulation models according to the methodology of the present invention illustrated schematically in FIGS. 7 and 8 and performed in the manner that has been set forth.

The computer memory 204 also contains stored computer operating instructions in the non-transitory form causing and controlling operation of Unstructured Gridding Module U and Reservoir Simulator Module R. The computer memory 204 also stores the data from data base 212 being manipulated and processed by the master node processor 202.

It should be noted that program code 222 may be in the form of microcode, programs, routines, or symbolic computer operable languages that provide a specific set of ordered operations that control the functioning of the data processing system D and direct its operation. The instructions of program code 222 may be stored in memory 204 of the data processing system D, or on computer diskette, magnetic tape, conventional hard disk drive, electronic read-only memory, optical storage device, or other appropriate data storage device having a computer usable non-transitory medium stored thereon. Program code 222 may also be contained on a data storage device such as server 220 as a non-transitory computer readable medium, as shown.

The data processing system D may be comprised of a single CPU, or a computer cluster as shown in FIG. 6, including computer memory and other hardware making it possible to manipulate data and obtain output data from input data. A cluster is a collection of computers, referred to as nodes, connected via a network. Usually a cluster has one or two head nodes or master processing nodes 202 used to synchronize the activities of the other nodes, referred to as processor nodes 224. The processor nodes 224 all execute the same computer program and work independently on different segments of the grid representing the reservoir.

Accordingly, in modeling for reservoir simulation with the present invention, input data are assembled and provided regarding the field, reservoirs, faults, and wellbore details from multiple data sources and databases, the geological model. Input data also includes the structured grid cell simulation model and its coordinates and structure, and also the structured grid cell simulation model and its coordinates and structure. Control parameters as specified by simulation engineers to control grid sizes in each zone and area, and the gridding options such as quad-tree refinement, are also provided as inputs.

The gridding simultaneously conforms multiple types of internal boundaries in the domain, as well as grid sizes and quality requirements for reservoir simulation being applied. The generated grid information, wellbore perforation information, fault description and interpolated property data are written to disk memory as model data files.

The model data files stored on disk memory are input files for parallel unstructured-grid reservoir simulation. Then, during parallel reservoir simulation, multiple computer processes are used to solve the well trajectory grid simulation consistency problem, preferably in a cluster computer. Each process in a cluster does the computation of a partition of the domain, called a subdomain.

The invention has been sufficiently described so that a person with average knowledge in the matter may reproduce and obtain the results mentioned in the invention herein. Nonetheless, any skilled person in the field of technique, subject of the invention herein, may carry out modifications not described in the request herein, to apply these modifications to a determined methodology, or in the performance and utilization thereof, requires the claimed matter in the following claims; such structures shall be covered within the scope of the invention.

It should be noted and understood that there can be improvements and modifications made of the present invention described in detail above, without departing from the spirit or scope of the invention as set forth in the accompanying claims.

What is claimed is:

1. A method of generating an unstructured grid model with actual well trajectory of at least one individual well of a plurality of wells of a subsurface reservoir during reservoir simulation by a reservoir simulator of a computer comprising a memory and a processor, the generating of the model being based on input data defining internal boundary geometry and internal boundary descriptions of the reservoir model provided by the computer, and on well trajectory and completion data for the wells in the reservoir obtained during drilling of the wells, the method comprising performing the computer implemented steps of:

storing, in the memory, computer operable instructions causing the processor to generate the unstructured grid with actual well trajectory of at least one individual well during the reservoir simulation;

performing in the processor under control of the stored computer operable instructions the steps of:

(a) receiving, from the memory, well perforation location coordinates of the wells in a structured grid model of the reservoir based on the well trajectory and completion data for the wells;

(b) obtaining well perforation location coordinates for well branches of the at least one individual well during drilling of the well branches;

(c) assembling the obtained well perforation location coordinates for the well branches of the individual well to generate an assembled set of well perforation location coordinates corresponding to a well path of the well;

(d) forming, using the assembled set of well perforation location coordinates, an interpolated well trajectory for the individual well by interpolation of a wellbore path between the assembled well perforation location coordinates for the well branches of the individual well, the forming comprising:

determining grid cells intersected by the well path corresponding to the assembled set of well perforation location coordinates;

determining, for each of the grid cells intersected by the well path, a location of a center of the cell;

for each of pair of adjacent cells of the grid cells intersected by the well path:

identifying a cell wall shared by the pair of adjacent cells;

determining a path of a line extending between the locations of the centers of the cells of the pair of adjacent cells; and determining an interpolated location corresponding to an intersection of the line with the cell wall shared between the pair of adjacent cells, connecting the interpolated locations for the pairs of adjacent cells intersected by the well path to form the interpolated well trajectory for the individual well (e) updating, based on the interpolated well trajectory for the individual well, the unstructured grid model of the reservoir to include the interpolated well trajectory for the individual well;

repeating steps (b) through (e) for each of the plurality of wells of the reservoir such that the unstructured grid model of the reservoir includes the interpolated well trajectories for the plurality of wells of the reservoir;

storing the unstructured grid model of the reservoir including the interpolated well trajectories for the plurality of wells of the reservoir; and comparing the formed unstructured grid model of the reservoir including the interpolated well trajectories for the plurality of wells of the reservoir with the structured grid model the reservoir.

2. The computer implemented method of claim 1, further including the step of:

storing the unstructured grid model of the reservoir including the interpolated well trajectory for the individual well.

3. The computer implemented method of claim 1, wherein the reservoir simulation comprises parallel reservoir simulation and the processor comprises at least one master node and a plurality of processor nodes, and further including the computer implemented step of:

storing, in the memory, computer operable instructions causing the at least one master node to synchronize the plurality of processor nodes during the parallel reservoir simulation.

4. The computer implemented method of claim 1, wherein the at least one individual well is a multilateral well.

5. The computer implemented method of claim 1, wherein the at least one individual well is multilateral horizontal well in a formation layer of the subsurface reservoir.

6. A data processing system generating an unstructured grid model with actual well trajectory of at least one individual well of a plurality of wells of a subsurface reservoir during reservoir simulation based on input data defining internal boundary geometry and internal boundary descriptions of the reservoir model, and on well trajectory and completion data for the wells in the reservoir obtained during drilling of the wells, the data processing system comprising:

(a) a reservoir simulator module performing the reservoir simulation and forming a structured grid model of the reservoir;

(b) an unstructured gridding module forming the unstructured grid for the unstructured grid model of the reservoir;

(c) a memory storing computer operable instructions to generate the unstructured grid with actual well trajectory of at least one individual well during the reservoir simulation;

(d) the memory further storing the input data defining internal boundary geometry and internal boundary descriptions of the reservoir model, and the well trajectory and completion data for the wells in the reservoir obtained during drilling of the wells; and (e) a processor performing under control of the stored computer operable instructions the steps of:

(1) receiving, from the memory, well perforation location coordinates of the wells in a structured grid model of the reservoir based on the well trajectory and completion data for the wells;

(2) obtaining well perforation location coordinates for well branches of the at least one individual well during drilling of the well branches:

(3) assembling the obtained well perforation location coordinates for the well branches of the individual well to generate an assembled set of well perforation location coordinates corresponding to a well path of the well;

(4) forming, using the assembled set of well perforation location coordinates, an interpolated well trajectory for the individual well by interpolation of a wellbore path between the assembled well perforation location coordinates for the well branches of the individual well, the forming comprising:

determining grid cells intersected by the well path corresponding to the assembled set of well perforation location coordinates;

determining, for each of the grid cells intersected by the well path, a location of a center of the cell;

for each of pair of adjacent cells of the grid cells intersected by the well path:

identifying a cell wall shared by the pair of adjacent cells;

determining a path of a line extending between the locations of the centers of the cells of the pair of adjacent cells; and determining an interpolated location corresponding to an intersection of the line with the cell wall shared between the pair of adjacent cells, connecting the interpolated locations for the pairs of adjacent cells intersected by the well path to form the interpolated well trajectory for the individual well; and (5) updating, based on the interpolated well trajectory for the individual well, the unstructured grid model of the reservoir to include the interpolated well trajectory for the individual well, repeating steps (e)(1) through (e)(5) for each of the plurality of wells of the reservoir such that the unstructured grid model of the reservoir includes the interpolated well trajectories for the plurality of wells of the reservoir;

storing, in the memory, the unstructured grid model of the reservoir including the interpolated well trajectories for the plurality of wells of the reservoir; and comparing, by the unstructured grid module, the formed unstructured grid model of the reservoir including the interpolated well trajectories for the plurality of wells of the reservoir with the structured grid model the reservoir.

7. The data processing system of claim 6, further including:

the memory storing the unstructured grid model of the reservoir including the interpolated well trajectory for the individual well.

8. The data processing system of claim 6, wherein:

the processor comprises:

a plurality of processor nodes performing the reservoir simulation as parallel reservoir simulation; and at least one master node synchronizing the operation of the plurality of processor nodes; and further including:

the storing memory computer operable instructions causing the at least one master node to synchronize the plurality of processor nodes during the parallel reservoir simulation.

9. The computer implemented method of claim 6, wherein the at least one individual well is a multilateral well.

10. The computer implemented method of claim 6, wherein the at least one individual well is a multilateral horizontal well in a formation layer of the subsurface reservoir.

11. A data storage device having stored in a non-transitory computer readable medium storing computer operable instructions for causing a data processing system to generate an unstructured grid model with actual well trajectory of at least one individual well of a plurality of wells of a subsurface reservoir during reservoir simulation by a reservoir simulator of a computer comprising a memory and a processor, the generating of the model being based on input data defining internal boundary geometry and internal boundary descriptions of the reservoir model provided by the computer, and on well trajectory and completion data for the wells in the reservoir obtained during drilling of the wells, the instructions stored in the data storage device causing the data processing system to perform the following steps:

storing, in the memory, computer operable instructions causing the processor to generate the unstructured grid with actual well trajectory of at least one individual well during the reservoir simulation;

performing, in the processor under control of the stored computer operable instructions, the steps of:

(a) receiving, from the memory, well perforation location coordinates of the wells in a structured grid model of the reservoir based on the well trajectory and completion data for the wells;

(b) obtaining well perforation location coordinates for well branches of the at least one individual well during drilling of the well branches;

(c) assembling the obtained well perforation location coordinates for the well branches of the individual well to generate an assembled set of well perforation location coordinates corresponding to a well path of the well;

(d) forming, using the assembled set of well perforation location coordinates, an interpolated well trajectory for the individual well by interpolation of a wellbore path between the assembled well perforation location coordinates for the well branches of the individual well, the forming comprising:

determining grid cells intersected by the well path corresponding to the assembled set of well perforation location coordinates;

determining, for each of the grid cells intersected by the well path, a location of a center of the cell;

for each of pair of adjacent cells of the grid cells intersected by the well path:

identifying a cell wall shared by the pair of adjacent cells;

determining a path of a line extending between the locations of the centers of the cells of the pair of adjacent cells; and determining an interpolated location corresponding to an intersection of the line with the cell wall shared between the pair of adjacent cells, connecting the interpolated locations for the pairs of adjacent cells intersected by the well path to form the interpolated well trajectory for the individual well; and (e) updating, based on the interpolated well trajectory for the individual well, the unstructured grid model of the reservoir to include the interpolated well trajectory for the individual well;

repeating steps (b) through (e) for each of the plurality of wells of the reservoir such that the unstructured grid model of the reservoir includes the interpolated well trajectories for the plurality of wells of the reservoir;

storing the unstructured grid model of the reservoir including the interpolated well trajectories for the plurality of wells of the reservoir; and comparing the formed unstructured grid model of the reservoir including the interpolated well trajectories for the plurality of wells of the reservoir with the structured grid model the reservoir.

12. The data storage device of claim 11, further including the instructions stored in the data storage device causing the data processing system to perform the step of:

storing the unstructured grid model of the reservoir including the interpolated well trajectory for the individual well.

13. The data storage device of claim 11, wherein the reservoir simulation comprises parallel reservoir simulation and the processor comprises at least one master node and a plurality of processor nodes, and further including the instructions stored in the data storage device causing the data processing system to perform the step of:

storing in the memory computer operable instructions causing the at least one master node to synchronize the plurality of processor nodes during the parallel reservoir simulation.

14. The data storage device of claim 11, wherein the at least one individual well is a multilateral well.

15. The data storage device of claim 11, wherein the at least one individual well is a multilateral horizontal well in a formation layer of the subsurface reservoir.

* * * * *

UNITED STATES PATENT AND TRADEMARK OFFICE
CERTIFICATE OF CORRECTION

| | |
|---|---|
| PATENT NO. | : 11,454,105 B2 |
| APPLICATION NO. | : 16/394455 |
| DATED | : September 27, 2022 |
| INVENTOR(S) | : Ding et al. |

It is certified that error appears in the above-identified patent and that said Letters Patent is hereby corrected as shown below:

In the Claims

In Column 13, Claim 5, Line 28 should read:
-- individual well is a multilateral horizontal well in a formation --

Signed and Sealed this
Eighth Day of November, 2022

Katherine Kelly Vidal
*Director of the United States Patent and Trademark Office*